(12) United States Patent
Shao et al.

(10) Patent No.: US 7,192,842 B2
(45) Date of Patent: Mar. 20, 2007

(54) METHOD FOR BONDING WAFERS

(75) Inventors: Shih-Feng Shao, Taipei Hsien (TW);
Hsin-Ya Peng, Taipei Hsien (TW);
Chen-Hsiung Yang, Taipei Hsien (TW)

(73) Assignee: Touch Micro-Systems Technology Inc., Taoyuan Hsien (TW)

( * ) Notice: Subject to any disclaimer, the term of this patent is extended or adjusted under 35 U.S.C. 154(b) by 0 days.

(21) Appl. No.: 10/905,794

(22) Filed: Jan. 20, 2005

(65) Prior Publication Data
US 2006/0084238 A1    Apr. 20, 2006

(30) Foreign Application Priority Data
Oct. 15, 2004   (TW) ............................... 93131383 A

(51) Int. Cl.
*H01L 21/30*   (2006.01)

(52) U.S. Cl. ................ 438/455; 438/456; 257/E21.122

(58) Field of Classification Search ........ 438/455–456; 257/E21.122
See application file for complete search history.

(56) References Cited

U.S. PATENT DOCUMENTS

| | | | |
|---|---|---|---|
| 5,699,094 A * | 12/1997 | Burke et al. | 347/63 |
| 6,942,750 B2 * | 9/2005 | Chou et al. | 156/272.2 |
| 2004/0062896 A1 | 4/2004 | Picone et al. | |
| 2005/0215054 A1 * | 9/2005 | Rasmussen et al. | 438/667 |

* cited by examiner

*Primary Examiner*—Matthew Smith
*Assistant Examiner*—Thanh V. Pham
(74) *Attorney, Agent, or Firm*—Winston Hsu

(57) ABSTRACT

A first wafer is provided, and a photosensitive masking-and-bonding pattern is formed on the surface of the first wafer. Then, an etching process using the photosensitive masking-and-bonding pattern as a hard mask is performed to form a wafer pattern on the surface of the first wafer. Finally, the first wafer is bonded to a second wafer with the photosensitive masking-and-bonding pattern.

12 Claims, 14 Drawing Sheets

METHOD FOR BONDING WAFERS

BACKGROUND OF INVENTION

1. Field of the Invention

The present invention relates to a method for bonding wafers, and more particularly, to a method that utilizes a photosensitive masking-and-bonding pattern to bond a first wafer and a second wafer. The photosensitive masking-and-bonding pattern functions as a mask pattern and a bonding layer, with which a wafer pattern of the first wafer is formed, the first wafer being then directly bonded to the second wafer without an additional bonding layer.

2. Description of the Prior Art

As the rapid development of micro-electromechanical system (MEMS) technologies progresses, the manufacturing processes of MEMS devices become increasingly complex. For the most part, semiconductor devices can be completely fabricated in a single wafer. On the contrary, MEMS devices, e.g. return path structures, have to be formed separately in two wafers, the two wafers then being bonded together to complete fabrication. Therefore, the conventional method for bonding wafers suffers from misalignment or limitations to the surface conditions of the wafers to be bonded or strict process conditions.

Please refer to FIG. 1 through FIG. 5. FIG. 1 through FIG. 5 are schematic diagrams illustrating a conventional method for bonding wafers. As shown in FIG. 1, a first wafer 10 is provided, and a photoresist layer 12 is coated onto the surface of the first wafer 10. As shown in FIG. 2, an exposure-and-development process is carried out to form a photoresist pattern 14 on the surface of the first wafer 10.

As shown in FIG. 3, an etching process is performed using the photoresist pattern 14 as a hard mask to etch regions of the first wafer 10 not protected by the photoresist pattern 14, thereby forming a wafer pattern 16 on the surface of the first wafer 10. As shown in FIG. 4, the photoresist pattern 14 is stripped, and a bonding pattern 18 is subsequently formed onto the surface of the first wafer 10. The material of the bonding pattern 18 is metal, solder, resin, or glass glue. The bonding pattern 18 is coated onto the surface of the first wafer 10, but does not overlapped the wafer pattern 16, using a shadow mask or by means of halftone printing. As shown in FIG. 5, a second wafer 20 is then affixed to the surface of the first wafer 10. The first wafer 10 and the second wafer 20 are therefore bonded together with the bonding pattern 18.

According to the conventional method, the bonding pattern 18 is coated onto the first wafer 10 in the areas around the wafer pattern 16 subsequent to removing the photoresist pattern 14. However, MEMS devices have sophisticated structures, and thus the critical dimensions of the wafer pattern 16 are extremely small. Consequently, the conventional method which utilizes a shadow mask or halftone printing to form the bonding pattern 18 usually leads to a misalignment problem (as indicated by the dotted line shown in FIG. 4). As long as the misalignment of the bonding pattern 18 occurs, the wafer pattern 16 will deviate (as indicated by the dotted line shown in FIG. 5) after the first wafer 10 and the second wafer 20 are bonded. This could degrade performance of the MEMS device. In view of the aforementioned problem, the conventional method is not suitable for use in bonding two wafers where the wafer pattern 16 is delicate. In addition, the conventional method is only suitable when the surface condition of the first wafer 10, e.g. the roughness of the first wafer 10, is proper.

In addition to the aforementioned conventional method, another conventional method which bonds two wafers directly is also well known. Please refer to FIG. 6 through FIG. 10. FIG. 6 through FIG. 10 are schematic diagrams illustrating another conventional method for bonding wafers. As shown in FIG. 6, a first wafer 30 is provided, and a photoresist layer 32 is coated onto the surface of the first wafer 30. As shown in FIG. 7, an exposure-and-development process is then performed to form a photoresist pattern 34 on the surface of the first wafer 30.

As shown in FIG. 8, an etching process is performed using the photoresist pattern 34 as a hard mask to etch the first wafer 30 not protected by the photoresist pattern 34 to form a wafer pattern 36 on the surface of the first wafer 30. As shown in FIG. 9, the photoresist pattern 34 is then stripped. As shown in FIG. 10, the first wafer 30 and a second wafer 38 are bonded in a direct manner. Direct bonding techniques include anodic bonding and fusion bonding. However, both the anodic bonding technique and the fusion bonding technique require numerous process steps, and have to be implemented when the surface condition is suitable. For example, the anodic bonding process has to be performed at a temperature of higher than 400° C. and an operation voltage of larger than 1000 V. The fusion bonding process has to be performed at a temperature of higher than 1000° C. Consequently, the direct bonding technologies are not suitable for fabricating devices incapable of resisting heat and high voltage.

SUMMARY OF INVENTION

It is therefore a primary object of the claimed invention to provide a method for bonding wafers to overcome the aforementioned problems.

According to a preferred embodiment of the present invention, a method for bonding wafers is provided. First, a first wafer is provided, and a photosensitive masking-and-bonding pattern is formed on the surface of the first wafer. Subsequently, an etching process is performed using the photosensitive masking-and-bonding pattern as a hard mask to form a wafer pattern on the surface of the first wafer. Finally, the first wafer is bonded to a second wafer by virtue of the photosensitive masking-and-bonding pattern.

The photosensitive masking-and-bonding pattern of the present invention has both masking and bonding functions, thereby preventing the misalignment problem. In addition, since the method according to the present invention is simple and does not necessitate certain process conditions, the present invention can be applied to fabricate various kinds of semiconductor devices and MEMS devices without any limitations.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
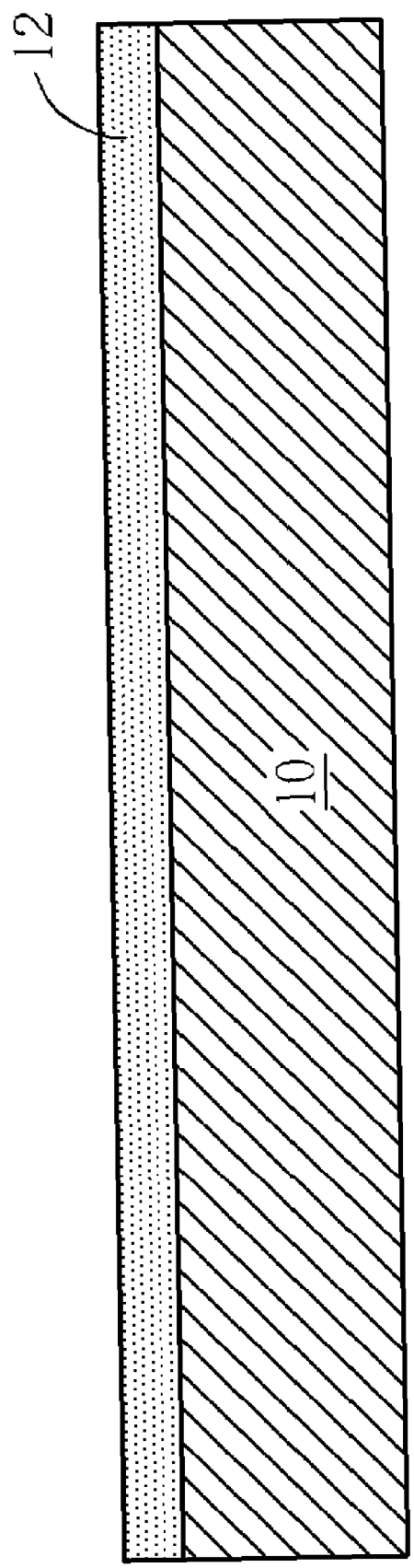
FIG. 1 through FIG. 5 are schematic diagrams illustrating a conventional method for bonding wafers.
Figure 2:
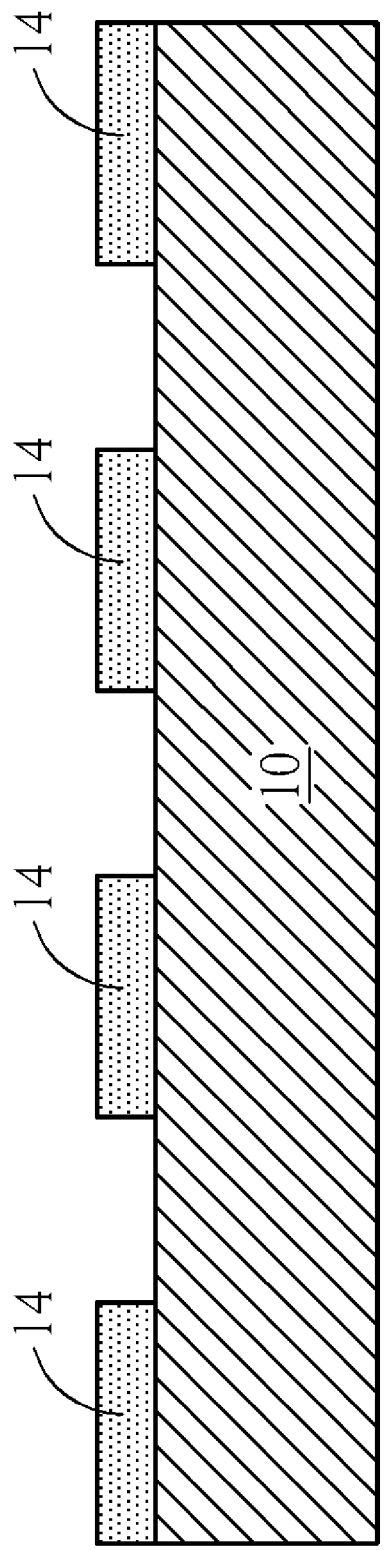
Figure 3:
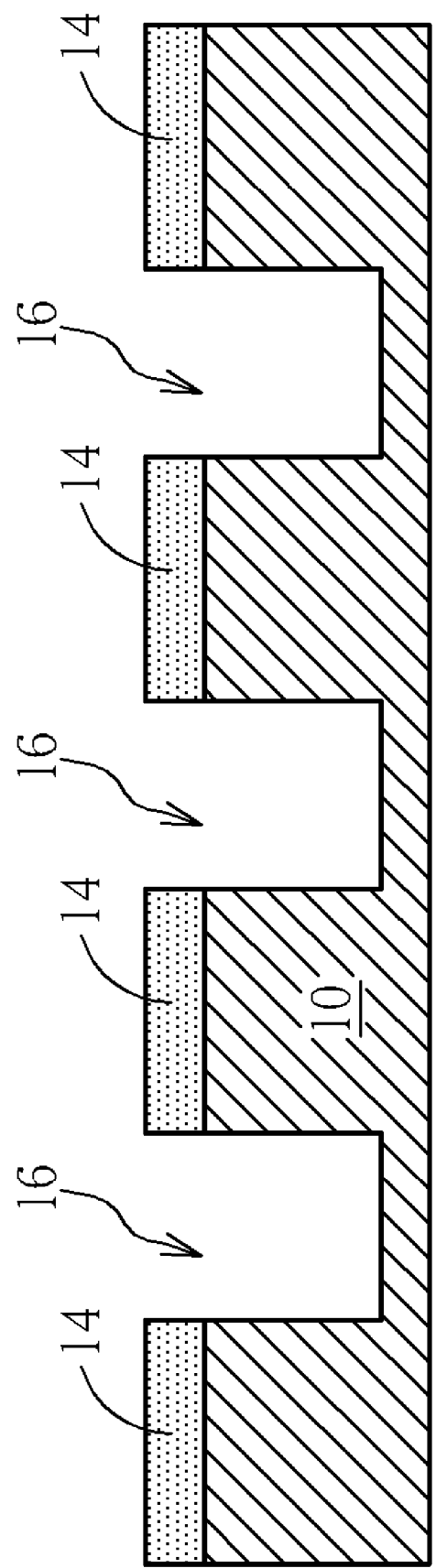
Figure 4:
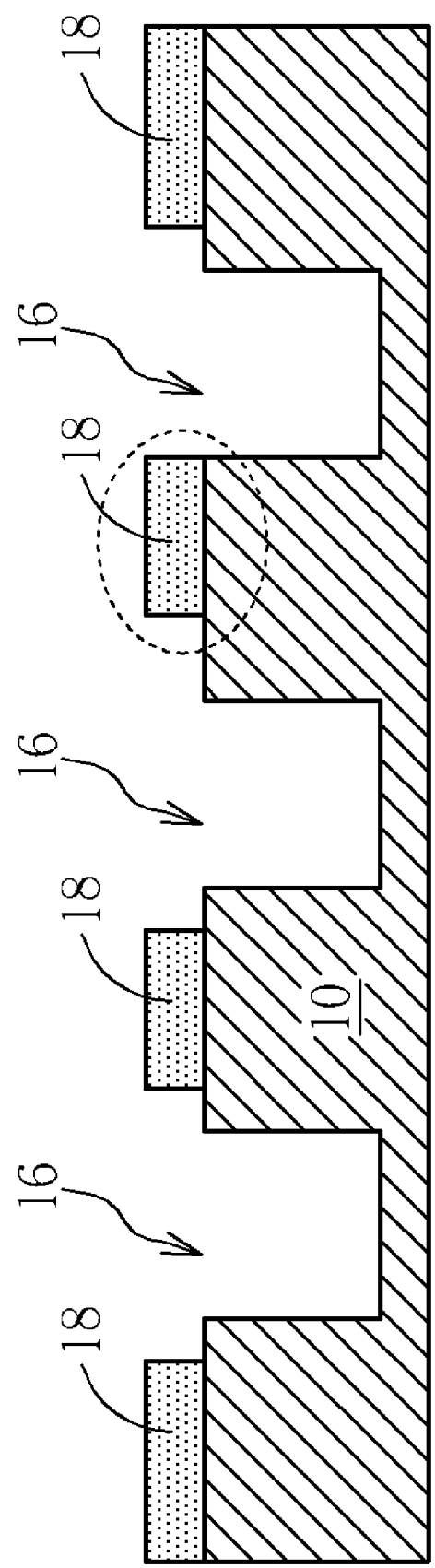
Figure 5:
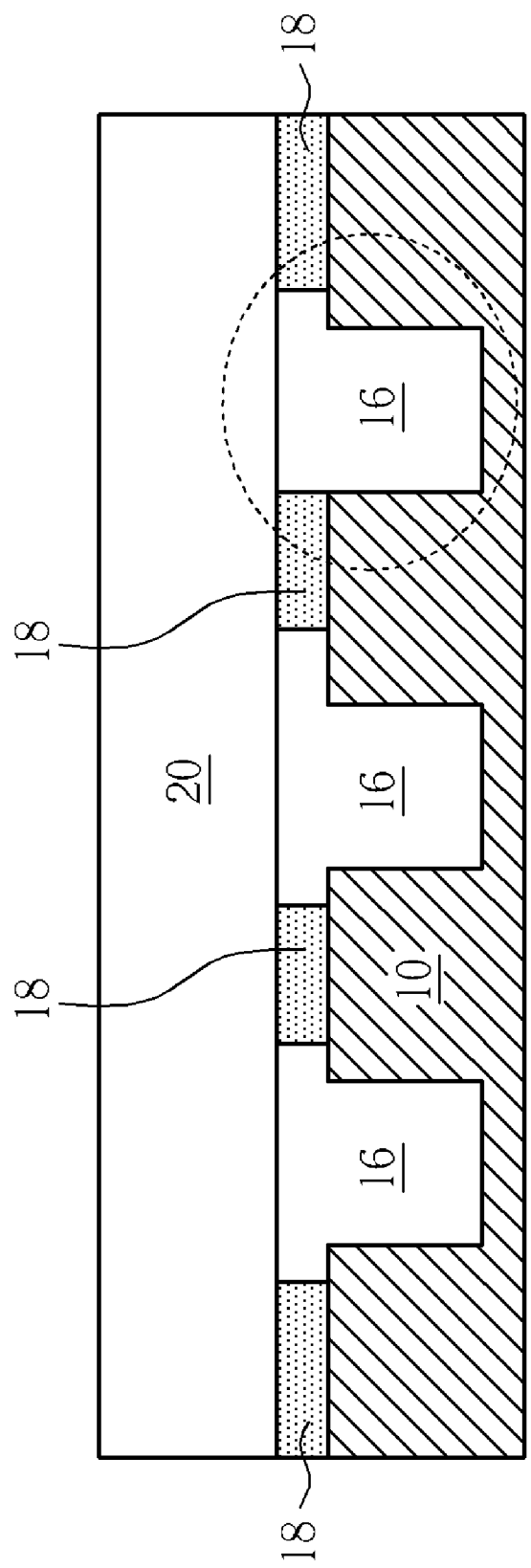
Figure 6:
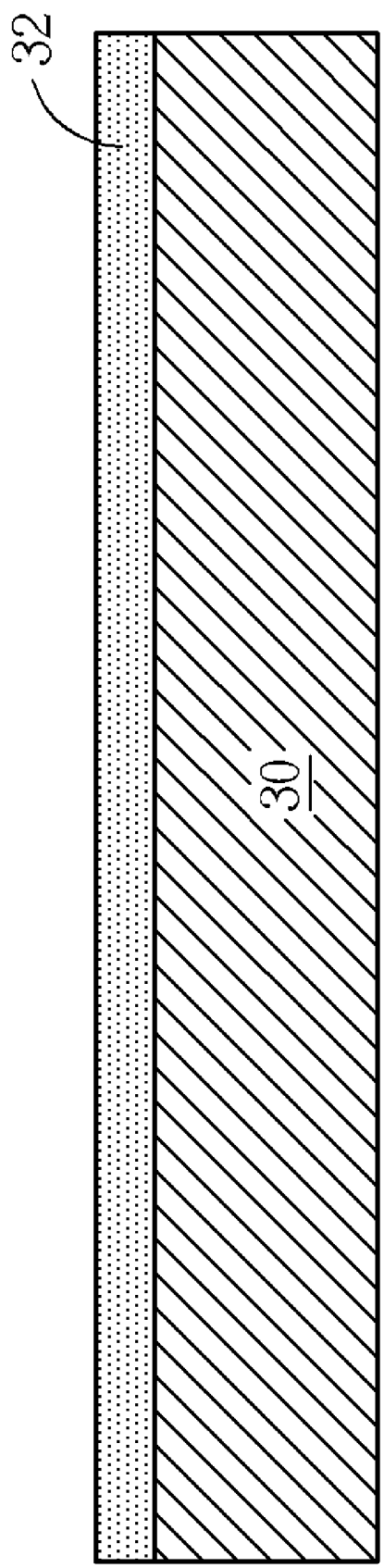
FIG. 6 through FIG. 10 are schematic diagrams illustrating another conventional method for bonding wafers.
Figure 7:
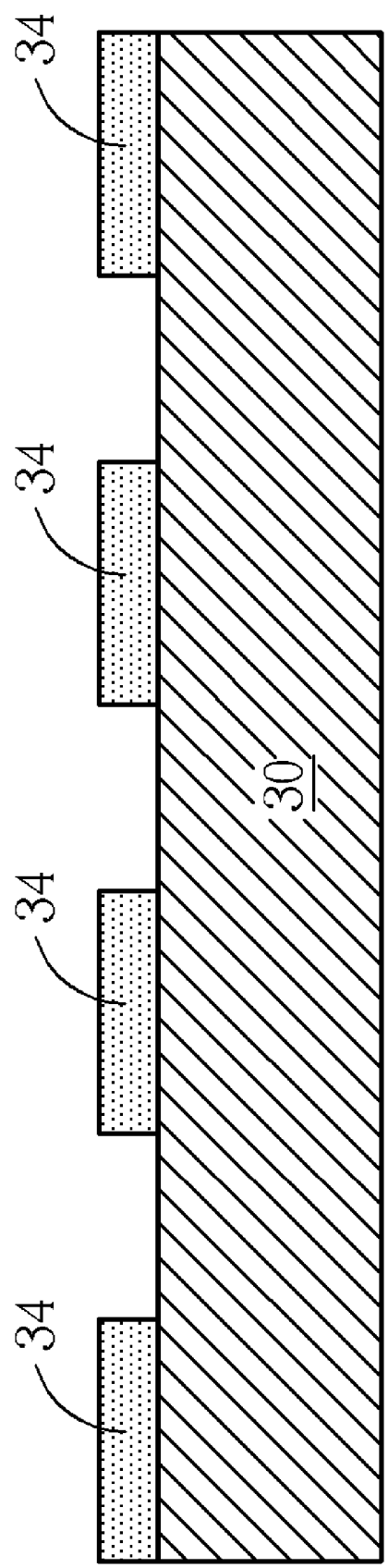
Figure 8:
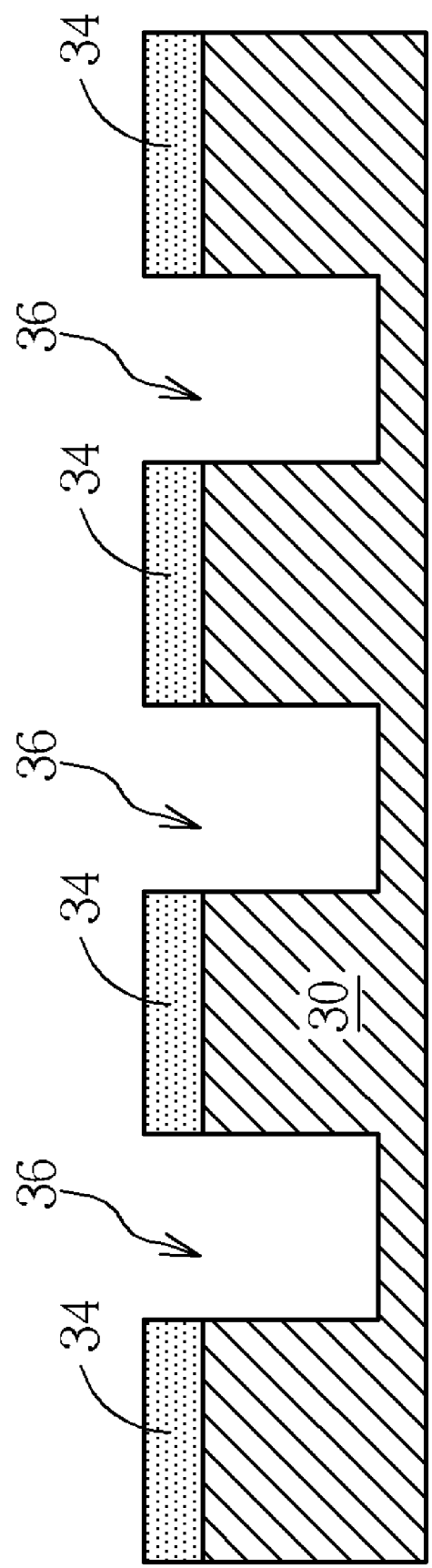
Figure 9:
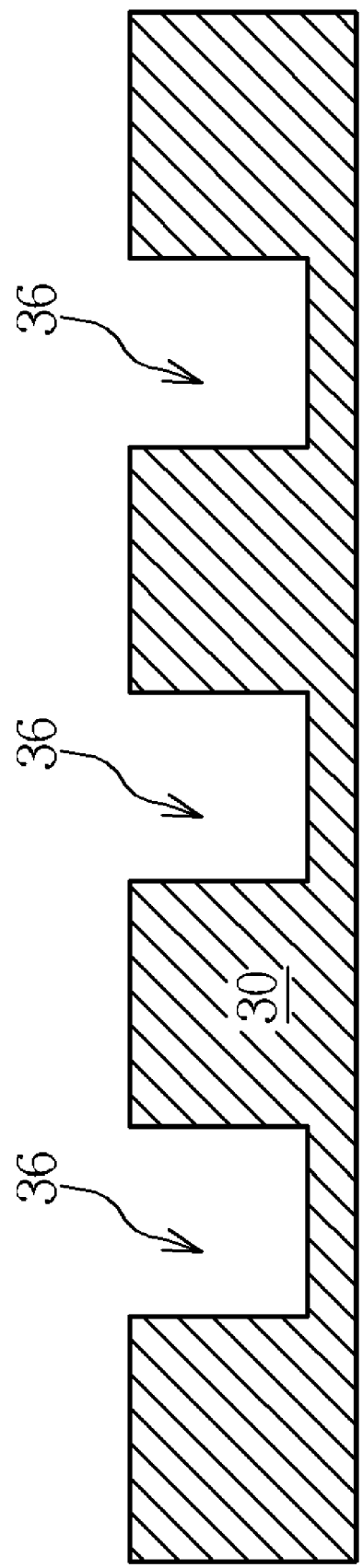
Figure 10:
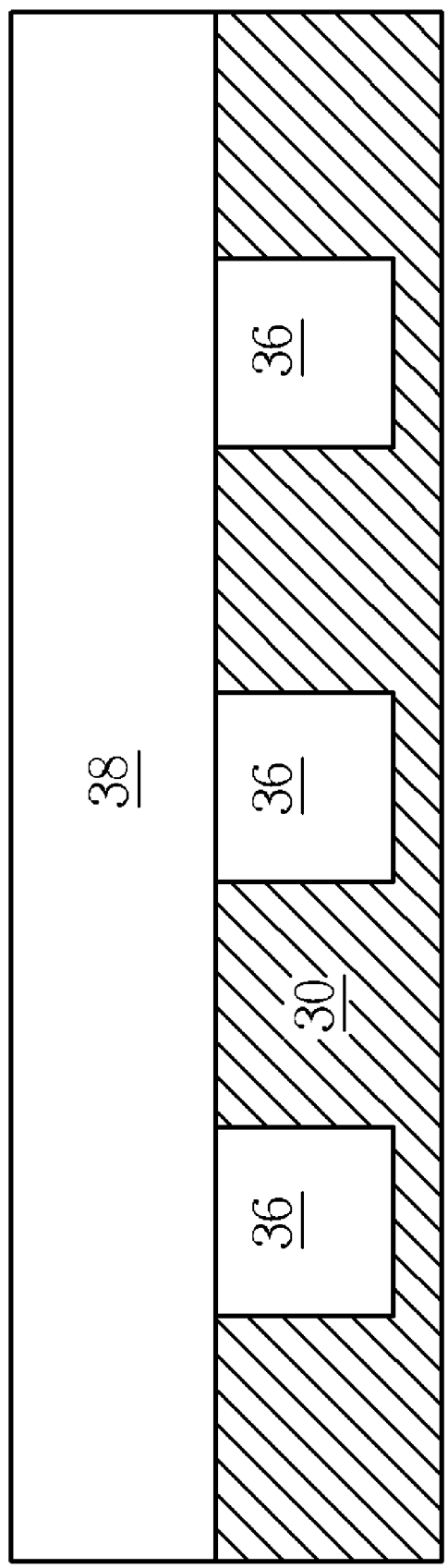
Figure 11:
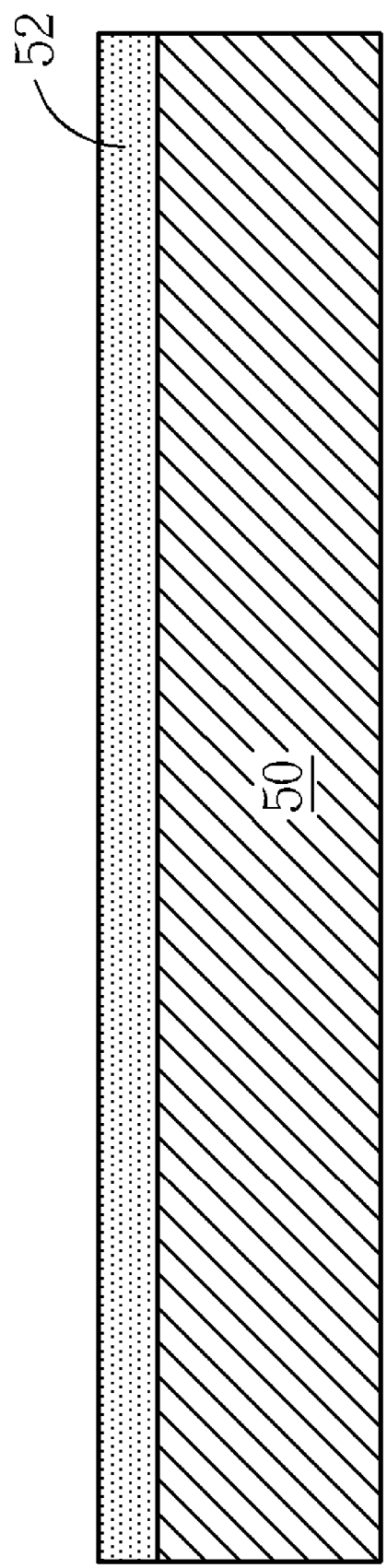
FIG. 11 through FIG. 14 are schematic diagrams illustrating a method for bonding wafers according to a preferred embodiment of the present invention.

Please refer to FIG. 11 through FIG. 14. FIG. 11 through FIG. 14 are schematic diagrams illustrating a method for bonding wafers according to a preferred embodiment of the present invention. As shown in FIG. 11, a first wafer 50 is provided, and a photosensitive masking-and-bonding layer 52 is formed on the surface of the first wafer 50. The first wafer 50 can be a silicon wafer, a glass wafer, a composite semiconductor (e.g. a gallium arsenide wafer), or another type of wafer suitable for fabricating semiconductor devices and MEMS devices. The photosensitive masking-and-bonding layer 52 is selected from materials which are capable of both the photoresisting and masking functions, for example, photosensitive benzocyclobutene (photosensitive BCB). Specifically, the photosensitive masking-and-bonding layer 52 is a photoresist layer in an exposure-and-development process, and becomes a bonding layer for bonding another wafer.

Figure 12:
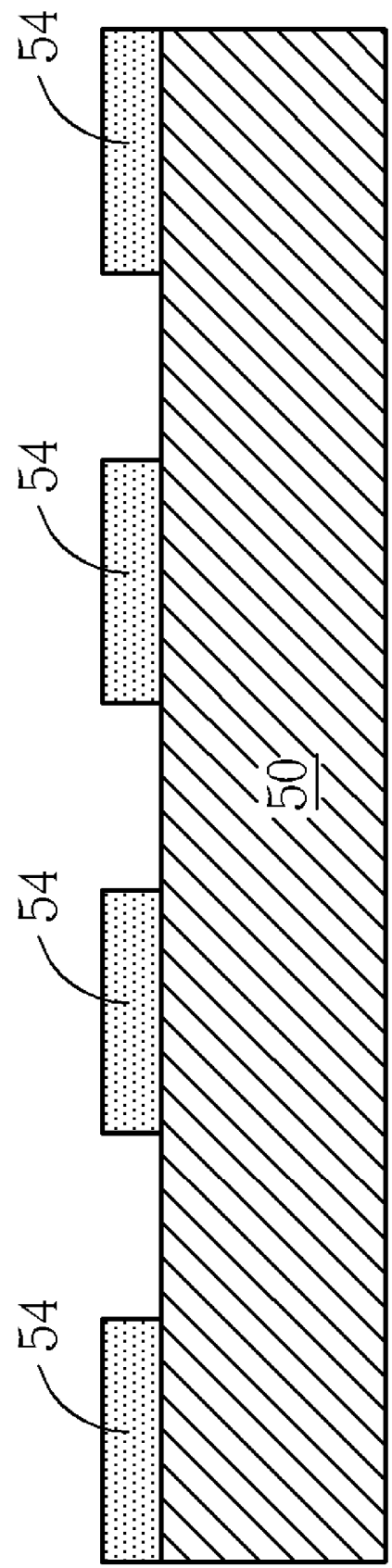
Figure 13:
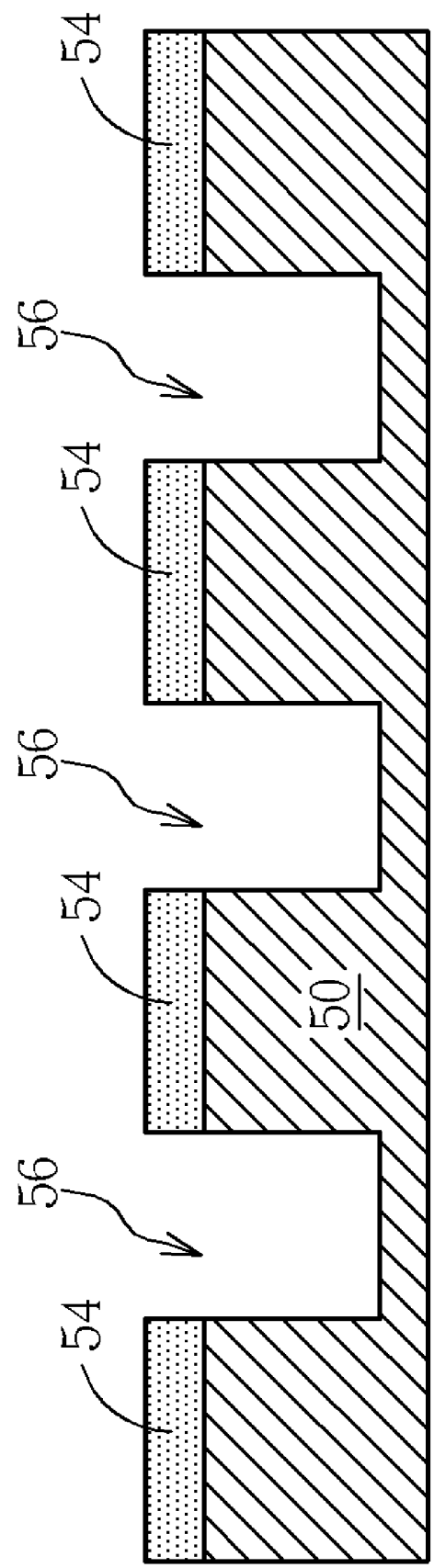

As shown in FIG. 12, an exposure-and-development process is performed to form a photosensitive masking-and-bonding pattern 54 on the surface of the first wafer 50. As shown in FIG. 13, an etching process is performed to etch region(s) of the first wafer 50 not protected by the photosensitive masking-and-bonding pattern 54, and therefore a wafer pattern 56 is formed on the surface of the first wafer 50.

Figure 14:
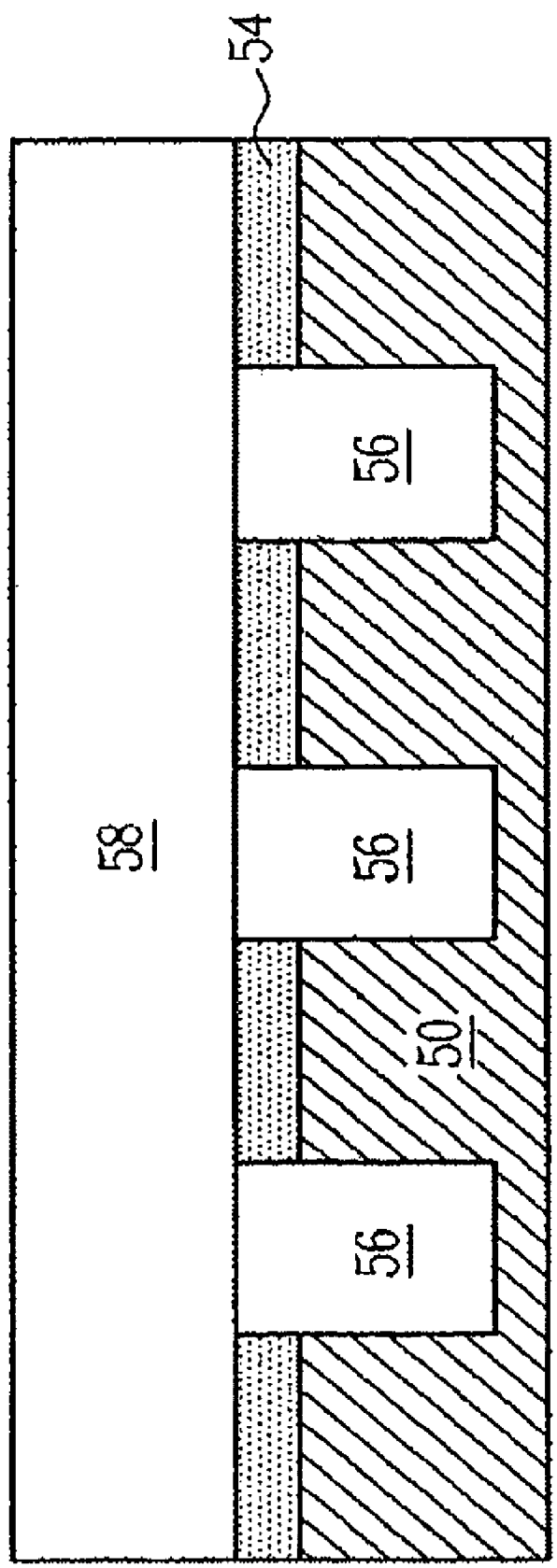

As shown in FIG. 14, the photosensitive masking-and-bonding pattern 54 is left on the surface of the first wafer 50, and functions as a bonding layer. The first wafer 50 is then bonded to a second wafer 58 with the photosensitive masking-and-bonding pattern 54. The wafer pattern 56 is sealed by the second wafer 58 and the masking-and-bonding pattern 54. so as to form an airtight space. The second wafer 58 can also be a silicon wafer, a glass wafer, a composite semiconductor, or another type of wafer suitable for fabricating semiconductor devices and MEMS devices. In addition, according to the desired devices br structures, the second wafer 58 may include a pre-formed pattern or structure (not shown). For example, the method of the present invention is commonly applied to, but not limited to, fabricate microfluid channel structures, such as return path structures.

In comparison with the prior art, the photosensitive masking-and-bonding pattern functions as a masking layer and a bonding layer. Consequently, the wafers being bonded are accurately aligned, and the bonding effect is enhanced. In addition, the method according to the present invention is simple and does not have to be carried out under certain process conditions. Therefore, the present invention can be applied to fabricate various kinds of semiconductor devices and MEMS devices without any limitations.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for bonding wafers, comprising:
   providing a first wafer;
   forming a photosensitive masking-and-bonding pattern on a surface of the first wafer;
   performing an etching process utilizing the masking-and-bonding pattern as a hard mask to form a wafer pattern in the first wafer; and
   utilizing the photosensitive masking-and-bonding pattern to directly bond the first wafer to a second wafer.

2. The method of claim 1, wherein the wafer pattern is sealed by the second wafer and the masking-and-bonding pattern.

3. The method of claim 2, wherein the wafer pattern forms a microfluid channel.

4. The method of claim 1, wherein the photosensitive masking-and-bonding pattern is selected from materials having a photoresisting-and-bonding effect.

5. The method of claim 1, wherein the photosensitive masking-and-bonding pattern is photosensitive benzocyclobutene (photosensitive BCB).

6. The method of claim 1, wherein the step of forming the photosensitive masking-and-bonding pattern comprises:
   coating a photosensitive masking-and-bonding layer onto the surface of the first wafer; and
   performing an exposure-and-development process to form the photosensitive masking-and-bonding pattern.

7. The method of claim 1, wherein the first wafer is a silicon wafer.

8. The method of claim 1, wherein the first wafer is a glass wafer.

9. The method of claim 1, wherein the first wafer is a composite semiconductor wafer.

10. The method of claim 1, wherein the second wafer is a silicon wafer.

11. The method of claim 1, wherein the second wafer is a glass wafer.

12. The method of claim 1, wherein the second wafer is a composite semiconductor wafer.

* * * * *

UNITED STATES PATENT AND TRADEMARK OFFICE
CERTIFICATE OF CORRECTION

PATENT NO. : 7,192,842 B2
APPLICATION NO. : 10/905794
DATED : March 20, 2007
INVENTOR(S) : Shih-Feng Shao et al.

It is certified that error appears in the above-identified patent and that said Letters Patent is hereby corrected as shown below:

Title page,
Item [73], Assignee, change "Touch Micro-Systems Technology INC." to
--"Touch Micro-System Technology INC."--

Signed and Sealed this

Twenty-ninth Day of May, 2007

JON W. DUDAS
*Director of the United States Patent and Trademark Office*